United States Patent
Chang et al.

(10) Patent No.: US 9,728,258 B1
(45) Date of Patent: Aug. 8, 2017

(54) TERNARY CONTENT ADDRESSABLE MEMORY

(71) Applicant: National Tsing Hua University, Hsinchu (TW)

(72) Inventors: Meng-Fan Chang, Taichung (TW); Wei-Chang Zhao, New Taipei (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 15/285,336

(22) Filed: Oct. 4, 2016

(51) Int. Cl.
*G11C 15/00* (2006.01)
*G11C 15/04* (2006.01)

(52) U.S. Cl.
CPC ............................ *G11C 15/04* (2013.01)

(58) Field of Classification Search
CPC ........................... G11C 15/04; G11C 15/046
USPC .................................. 365/49.1, 49.11, 51
See application file for complete search history.

(56) References Cited

U.S. PATENT DOCUMENTS

| | | | |
|---|---|---|---|
| 6,798,006 B2 * | 9/2004 | Amo ................. | H01L 21/76895 257/296 |
| 6,900,999 B1 | 5/2005 | Yen et al. | |
| 7,064,971 B2 | 6/2006 | Shau | |
| 8,233,302 B2 * | 7/2012 | Arsovski ................ | G11C 15/04 365/156 |
| 8,848,412 B1 * | 9/2014 | Yeung .................... | G11C 15/00 365/49.1 |
| 9,418,741 B1 * | 8/2016 | Ramaraju .............. | G11C 15/00 |
| 9,431,070 B1 * | 8/2016 | Chang .................... | G11C 7/062 |
| 9,484,096 B1 * | 11/2016 | Chen ..................... | G11C 15/043 |
| 9,502,114 B1 * | 11/2016 | Lin ....................... | G11C 15/046 |
| 9,543,015 B1 * | 1/2017 | Roy ...................... | G11C 15/046 |
| 2003/0179623 A1 * | 9/2003 | Inoue ................... | G11C 15/043 365/200 |
| 2005/0157526 A1 * | 7/2005 | Hanzawa .............. | G11C 15/043 365/49.12 |
| 2005/0201132 A1 * | 9/2005 | Shin ...................... | G11C 15/04 711/108 |
| 2005/0213359 A1 * | 9/2005 | Kim ...................... | G11C 15/00 365/49.1 |
| 2005/0276086 A1 * | 12/2005 | Perry .................... | G11C 15/04 365/49.17 |
| 2006/0193160 A1 * | 8/2006 | Hanzawa .............. | G11C 15/04 365/49.15 |

(Continued)

FOREIGN PATENT DOCUMENTS

| CN | 1540669 | 10/2004 |
|---|---|---|
| CN | 100505097 | 6/2009 |

(Continued)

*Primary Examiner* — Viet Q Nguyen
(74) *Attorney, Agent, or Firm* — J.C. Patents

(57) ABSTRACT

A ternary content addressable memory includes at least one first memory cell, at least one second memory cell and at least one switch set. The first memory cell receives a first search signal, determines whether to send first stored data to a common end or not according to the first search signal. The second memory cell receives a second search signal, determines whether to send second stored data to the common end or not according to the second search signal. The switch set adjusts a resistance of a path between the match line and the reference ground according to a voltage on the common end and a third search signal.

13 Claims, 4 Drawing Sheets

(56) References Cited

U.S. PATENT DOCUMENTS

| | | | | |
|---|---|---|---|---|
| 2007/0008760 A1* | 1/2007 | Nii | ............... | G11C 15/04 |
| | | | | 365/233.1 |
| 2007/0097740 A1* | 5/2007 | Derhacobian | ....... | G11C 11/5678 |
| | | | | 365/163 |
| 2007/0247885 A1* | 10/2007 | Watanabe | ............ | G11C 15/04 |
| | | | | 365/49.17 |
| 2009/0113122 A1* | 4/2009 | Dosaka | ............ | G06F 17/30982 |
| | | | | 711/108 |
| 2014/0347906 A1* | 11/2014 | Menut | ............ | G11C 15/04 |
| | | | | 365/49.17 |
| 2015/0200010 A1* | 7/2015 | Liaw | ............ | G11C 15/04 |
| | | | | 257/390 |
| 2015/0348629 A1* | 12/2015 | Chang | ............ | G11C 15/046 |
| | | | | 365/49.17 |

FOREIGN PATENT DOCUMENTS

| | | |
|---|---|---|
| TW | 201511002 | 3/2015 |
| TW | I508069 | 11/2015 |

\* cited by examiner

TERNARY CONTENT ADDRESSABLE MEMORY

BACKGROUND OF THE INVENTION

Field of Invention

The present invention generally relates to a ternary content addressable memory (TCAM), and more particularly to a TCAM with fewer circuit components.

Description of Prior Art

A content addressable memory (CAM) has a plurality of memory cells for storing stored data. Furthermore, the content addressable memory can receive search signal, and compares the search signals with stored data of selected memory cell. If the stored data of selected memory cell and the search signal are the same, a search result is match, and if the stored data of selected memory cell and the search signal are different, a search result is miss. That is, a search 1 operation or a search 0 operation can be operated on the CAM. The search 1 operation is used to search whether the stored data of the selected memory cell is 1 or not, and the search 0 operation is used to search whether the stored data of the selected memory cell is 0 or not.

On the other hand, a ternary content addressable memory (TCAM) is also provided in conventional art. Different from the CAM, the TCAM can also operates a search don't care operation. When the search don't care operation is operated on the selected memory cell, the stored data would not be compared with the search signal, and the search result is always match.

SUMMARY OF THE INVENTION

The present disclosure provides a ternary content addressable memory (TCAM) with fewer circuit components.

The present disclosure provides the TCAM including at least one first memory cell, at least one second memory cell and at least one switch set. The first memory cell receives a first search signal, determines whether to send first stored data to a common end or not according to the first search signal. The second memory cell receives a second search signal, determines whether to send second stored data to the common end or not according to the second search signal. The switch set is coupled to the common end, a reference ground, and a match line. The switch set adjusts a resistance of a path between the match line and the reference ground according to a voltage on the common end and a third search signal.

In an embodiment of present disclosure, wherein the switch set includes a first switch and a second switch. The first switch has a control end coupled to the common end, and a first end coupled to the match line. The second switch has a first end coupled to a second end of the first switch, a second end coupled to the reference ground, and a control end receiving the third search signal.

In an embodiment of present disclosure, wherein if the first search signal is at a first logic level and the second search signal is at a second logic level, a search 1 operation is operated, if the first search signal is at the second logic level and the second search signal is at the first logic level, a search 0 operation is operated, and if both of the first search signal and the second search signal are at the second logic level, a search don't care operation is operated.

In an embodiment of present disclosure, wherein if the search 1 operation or the search 0 operation is operated, the third search signal is at the first logic level, and if the search don't care operation is operated, the third search signal is at the second logic level.

In an embodiment of present disclosure, the TCAM further includes a pull-up circuit. The pull-up circuit is coupled to the match line, and the pull-up circuit is used for pulling up a voltage level of the match line according to a power voltage during a pre-charge phase or an evaluation phase.

In an embodiment of present disclosure, wherein the pull-up circuit pulls up a voltage level of the match line to the first logic level during the pre-charge phase before each of the search 0, search 1, and search don't operations being operated, the switch set pulls down the voltage level of the match line to the reference ground during the evaluation phase if a search result of each of the search 0, search 1, and search don't operations is miss, and the voltage level of the match line is held on the first logic level during the evaluation phase if the search result of each of the search 0, search 1, and search don't operations is match.

In an embodiment of present disclosure, wherein a voltage level of the match line is held on the reference ground during the pre-charge phase before each of the search 0, search 1, and search don't operations being operated, the pull-up circuit pulls up the voltage level of the match line to a first voltage level during the evaluation phase if a search result of each of the search 0, search 1, and search don't operations is match, and the pull-up circuit pulls up the voltage level of the match line to a second voltage level during the evaluation phase if the search result of each of the search 0, search 1, and search don't operations is miss. Wherein, the first voltage level is larger than the second voltage level.

In an embodiment of present disclosure, wherein if the search don't care operation is operated, the path between the match line and the reference ground is cut-off according to the third search signal.

In an embodiment of present disclosure, wherein each of the first memory cell and the second memory cell includes a data latch and a first switch. The data latch has a data end for receiving or outputting a stored data, and an inverted data end for receiving or outputting an inverted stored data. The first switch is coupled between the common end and the data end, and controlled by the corresponding search signal to be turned on or cut-off.

In an embodiment of present disclosure, wherein each of the first memory cell and the second memory cell further includes a second switch. The second switch is coupled between the inverted data end and a bit line, and controlled by a word line signal.

In an embodiment of present disclosure, wherein the latch circuit includes a first transistor, a second transistor, a third transistor and a fourth transistor. The first transistor has a first end receiving a power voltage, a second end coupled to the data end, and a control end coupled to the inverted data end. The second transistor has a first end coupled to the data end, a second end coupled to the reference ground, and a control end coupled to the inverted data end. The third transistor has a first end receiving the power voltage, a second end coupled to the inverted data end, and a control end coupled to the data end. The fourth transistor has a first end coupled to the inverted data end, a second end coupled to the reference ground, and a control end coupled to the data end.

In an embodiment of present disclosure, wherein the first switch includes a fifth transistor. The fifth transistor has a first end coupled to the data end, a second end coupled to the common end, and a control end for receiving the corresponding search signal.

In an embodiment of present disclosure, the TCAM further includes a boost circuit. The boost circuit is coupled to the control end of the fifth transistor, and used for booting-up a voltage level of the corresponding search signal by a threshold voltage of the fifth transistor when the corresponding search signal is at logic high.

In summary, in present disclosure, the first and second search signals are respectively provided to the first memory cell and the second memory cell. Such as that, the voltage level on the common end can be determined according to the stored data is the first memory cell and the second memory cell, and the first and second search signals. Further, the switch set adjusts a resistance of a path between the match line and the reference ground according to the voltage level on the common end, and a voltage level of the match line can be determined according to the resistance. Such as that, search results can be determined according to the voltage level of the match line.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiment of the invention, examples of which are illustrated in the accompanying drawings.

Figure 1:
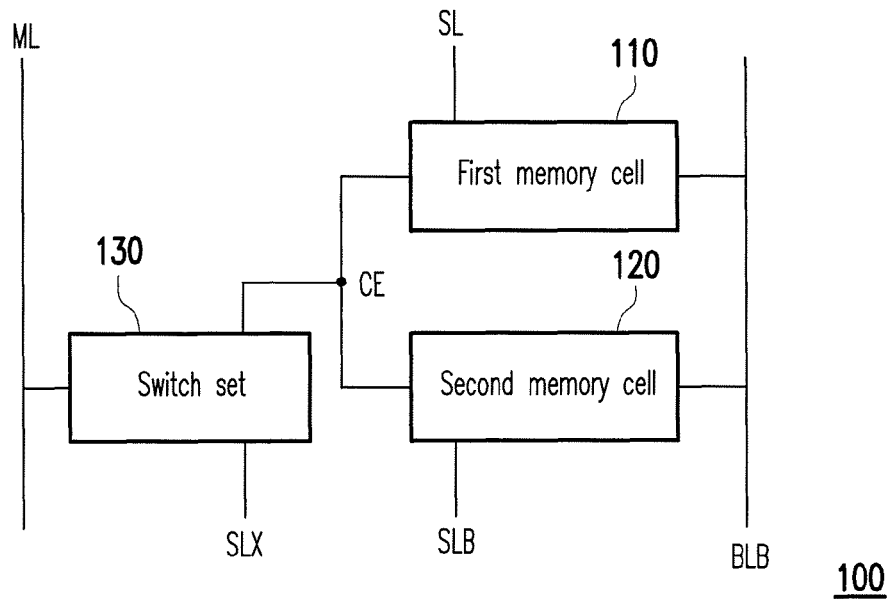
FIG. 1 illustrates a block diagram of a ternary content addressable memory (TCAM) according to an embodiment of present disclosure.

Please refer to FIG. 1, FIG. 1 illustrates a block diagram of a ternary content addressable memory (TCAM) according to an embodiment of present disclosure. The TCAM 100 includes a first memory cell 110, a second memory cell 120 and a switch set 130. The first memory cell 110 and the second memory cell 120 are coupled to a common end CE. The first memory cell 110 receives a search signal SL, and the first memory cell 110 determines whether to send stored data which is stored in the first memory cell 110 to the common end CE or not according to the search signal SL. On the other hand, the second memory cell 120 receives a search signal SLB, and the second memory cell 120 determines whether to send stored data which is stored in the second memory cell 120 to the common end CE or not according to the search signal SLB.

The first memory cell 110 and the second memory cell 120 can be used to store one bit data. By encoding the first memory cell 110 and the second memory cell 120, an encoded bit with logic levels 0, 1 or don't care can be obtained. For example, if logic levels of the stored data in the first memory cell 110 and the second memory cell 120 are respectively 0 1, the encoded bit with logic level 1 can be obtained; if the logic levels of the stored data in the first memory cell 110 and the second memory cell 120 are respectively 1 0, the encoded bit with logic level 0 can be obtained; and if the logic levels of the stored data in the first memory cell 110 and the second memory cell 120 are respectively 0 0, the encoded bit with logic level don't care can be obtained.

The switch set 130 is coupled between a match line ML and the common end CE. The switch set 130 receives a voltage on the common end CE and a search signal SLX, and the switch set 130 may be used to adjust a resistance of a path between the match line ML and a reference ground according to a voltage level on the common end CE and the search signal SLX.

In detail operation of this embodiment, a search 0 operation, a search 1 operation, and a search don't operation can be operated on the TCAM 100. When the search 1 operation is operated, the search signal SL is set to a first logic level (for example logic level 1), the search signal SLB is set to a second logic level (for example logic level 0), and the search signal SLX is set to the first logic level. Then, the first memory cell 110 determines to send stored data thereof to the common end CE according to the search signal SL and the second memory cell 120 determines not to send stored data thereof to the common end CE according to the search signal SLB. If the stored data in the first memory cell 110 is logic level 0, the switch set 130 adjusts the resistance of the path between the match line ML and the reference ground to a high value according to the voltage level on the common end CE and the search signal SLX. Such as that, the voltage level on the match line ML may be held on a high voltage level, and the search result with "match" can be obtained. On the contrary, if the stored data in the first memory cell 110 is logic level 1, the switch set 130 adjusts the resistance of the path between the match line ML and the reference ground to a low value according to the voltage level on the common end CE and the search signal SLX. Such as that, the voltage level on the match line ML may be pulled down toward to the reference ground, and the search result with "miss" can be obtained.

When the search 0 operation is operated, the search signal SL is set to the second logic level (for example logic level 0), the search signal SLB is set to the first logic level (for example logic level 1), and the search signal SLX is set to the first logic level. Then, the first memory cell 110 determines not to send stored data thereof to the common end CE according to the search signal SL and the second memory cell 120 determines to send stored data thereof to the common end CE according to the search signal SLB. If the stored data in the second memory cell 120 is logic level 0, the switch set 130 adjusts the resistance of the path between the match line ML and the reference ground to a high value according to the voltage level on the common end CE and the search signal SLX. Such as that, the voltage level on the match line ML may be held on a high voltage level, and the search result with "match" can be obtained. On the contrary, if the stored data in the second memory cell 120 is logic level 1, the switch set 130 adjusts the resistance of the path between the match line ML and the reference ground to a low value according to the voltage level on the common end CE and the search signal SLX. Such as that, the voltage level on the match line ML may be pulled down toward to the reference ground, and the search result with "miss" can be obtained.

When the search don't care operation is operated, all of the search signals SL, SLB and SLX are set to the second logic level (for example logic level 0). Both of the first and second memory cells 110 and 120 determine not to send stored data to the common end CE. Accordingly, the common end CE is at high impedance regardless the stored data of the first and second memory cells 110 and 120, and the switch set 130 adjusts the resistance of the path between the match line ML and the reference ground to a high value according to the voltage level on the common end CE and the search signal SLX. In this embodiment, the switch set 130 cut-off the path between the match line ML and the reference ground according to the search signal SLX with logic level 0. Such as that, the match line ML may be held on a high voltage level, and the search result with "match" can be obtained.

Figure 2A:
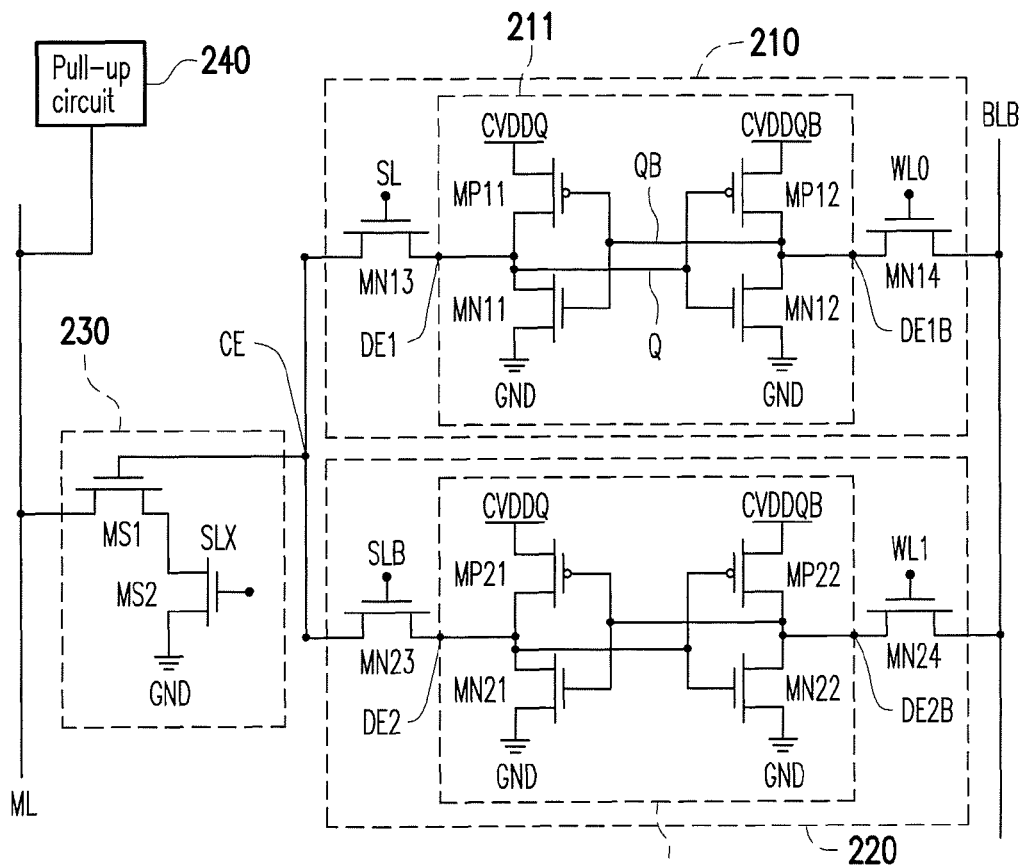
FIG. 2A illustrates a schematic diagram of a TCAM according to another embodiment of present disclosure.

Please refer to FIG. 2A, FIG. 2A illustrates a schematic diagram of a TCAM according to another embodiment of present disclosure. The TCAM 200 includes a first memory cell 210, a second memory 220, a switch set 230, and a pull-up circuit 240. The first memory cell 210 and the second memory cell 220 may be static random access memory cells. The first memory cell 210 includes a data latch 211 and switches formed by transistors MN13 and MN14. The data latch 211 includes transistors MP11-MP12 and MN11-MN12. A first end of the transistor MP11 receives a first power voltage CVDDQ, a second end of the transistor MP11 coupled to a data end DE1, and a control end coupled to the inverted data end DE1B. A first end of the transistor MN11 is coupled to the data end DE1, a second end of the transistor MN11 is coupled to the reference ground GND, and a control end of the transistor MN11 is coupled to the inverted data end DE1B. A first end of the transistor MP12 receives a second power voltage CVDDQB, a second end of the transistor MP12 is coupled to the inverted data end DE1B, and a control end of the transistor MP12 is coupled to the data end DE1. Moreover, a first end of the transistor MN12 is coupled to the inverted data end DE1B, a second end of the transistor MN12 is coupled to the reference ground GND, and a control end of the transistor MN12 is coupled to the data end DE1.

The switch formed by the transistor MN13 is coupled between the common end CE and the data end DE1, and is controlled by the search signal SL. The switch formed by the transistor MN14 is coupled between the inverted data end DE and a bit line BLB, and is controlled by a word line signal WL0.

The second memory cell 220 includes a data latch 221 and switches formed by transistors MN23 and MN24. The data latch 221 includes transistors MP21-MP22 and MN21-MN22. A first end of the transistor MP21 receives the first power voltage CVDDQ, a second end of the transistor MP21 coupled to a data end DE2, and a control end coupled to the inverted data end DE2B. A first end of the transistor MN21 is coupled to the data end DE2, a second end of the transistor MN21 is coupled to the reference ground GND, and a control end of the transistor MN21 is coupled to the inverted data end DE2B. A first end of the transistor MP22 receives the second power voltage CVDDQB, a second end of the transistor MP22 is coupled to the inverted data end DE2B, and a control end of the transistor MP22 is coupled to the data end DE2. Moreover, a first end of the transistor MN22 is coupled to the inverted data end DE2B, a second end of the transistor MN22 is coupled to the reference ground GND, and a control end of the transistor MN22 is coupled to the data end DE2.

The switch formed by the transistor MN23 is coupled between the common end CE and the data end DE2, and is controlled by the search signal SLB. The switch formed by the transistor MN24 is coupled between the inverted data end DE2B and the bit line BLB, and is controlled by a word line signal WL1.

The switch set 230 includes switches formed by transistors MS1 and MS2. The switch formed by the transistor MS1 has a first end coupled to the match line ML, a second end coupled to a first end of the transistor MS2, and a control end coupled to the common end CE. The switch formed by the transistor MS2 is coupled between the transistor MS1 and the reference ground GND, and is controlled by the search signal SLX.

The pull-up circuit 240 is coupled to the match line ML. The pull-up circuit 240 is used to pull up the voltage level of the match line according to the power voltage VDD during a pre-charge phase or an evaluation phase. In some embodiment, the pull-up circuit 240 can be implemented by a P-type transistor which coupled between the match line ML and the power voltage VDD.

Figure 2B:
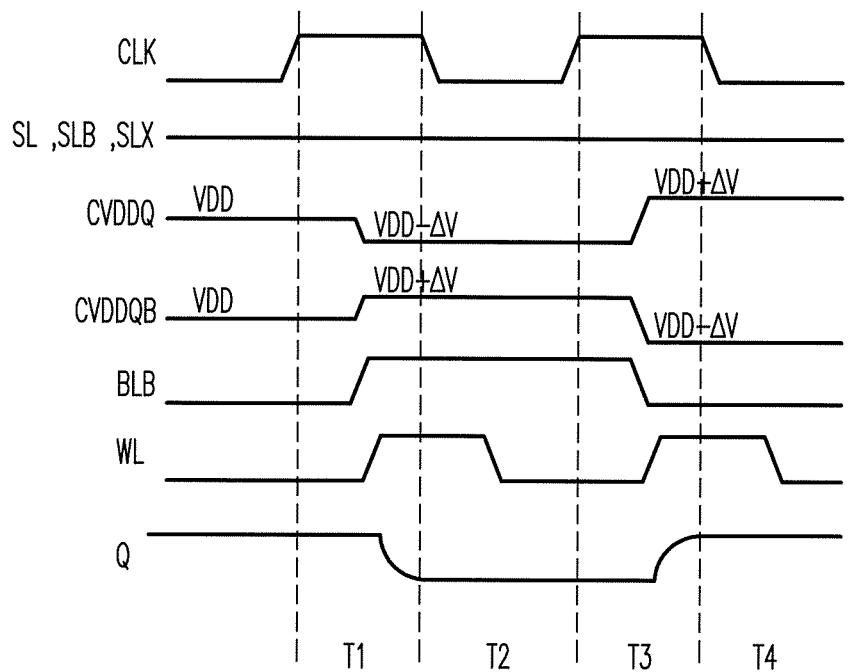
FIG. 2B illustrates a waveform plot for writing operations of the TCAM 200 according to the embodiment of FIG. 2A.

Please refer to FIG. 2B and FIG. 2A, wherein FIG. 2B illustrates a waveform plot for writing operations of the TCAM 200 according to the embodiment of FIG. 2A. The writing operations of the TCAM 200 can be controlled a clock signal CLK, and when the writing operations are operated, the search signals SL, SLB and SLX are set to logic level 0. For operating an writing operation to write logic level 0 to the first memory cell 210, during a time period T1, both of a signal on the bit line BLB and a word line signal WL transit to logic level 1, the first power voltage CVDDQ varies to VDD−ΔV and the second power voltage CVDDQB varies to VDD+ΔV. Wherein an offset voltage ΔV is a positive value. Since the first power voltage CVDDQ is decreased and the second power voltage CVDDQB is increased, such as that, a tripoint of the inverter formed by the transistors MP11 and MN11 is reduced and a tripoint of the inverter formed by the transistors MP12 and MN12 is increased. Correspondingly, a voltage on an end QB can be varied from logic level 0 to logic level 1 easily, the writing operation can be completely during a time period T2, and a voltage on an end Q with logic level 0 can be obtained in time period T2.

On the other hand, for operating an writing operation to write logic level 1 to the first memory cell 210, during a time period T3, a signal on the bit line BLB transits to logic level 0 and a word line signal WL transits to logic level 1, the first power voltage CVDDQ varies to VDD+ΔV and the second power voltage CVDDQB varies to VDD−AV. Since the first power voltage CVDDQ is increased and the second power voltage CVDDQB is decreased, such as that, the tripoint of the inverter formed by the transistors MP11 and MN11 is increased and the tripoint of the inverter formed by the transistors MP12 and MN12 is decreased. Correspondingly, the voltage on the end QB can be varied from logic level 1 to logic level 0 easily, the writing operation can be completely during a time period T4, and a voltage on an end Q with logic level 1 can be obtained in time period T4.

That is, during the writing operations, the voltage levels of the first power voltage CVDDQ and the second power voltage CVDDQB can be varied in opposite way for assisting the writing operation. Furthermore, the voltage levels of the first power voltage CVDDQ and the second power voltage CVDDQB can be the same when the corresponding memory cell is not operated in the writing operation.

Figure 3A:
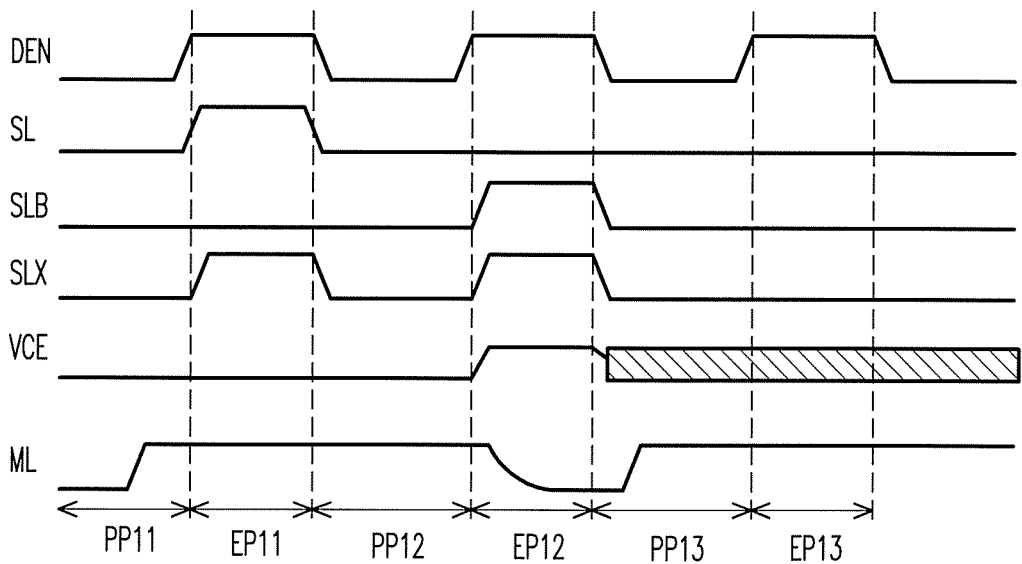
FIG. 3A and FIG. 3B respectively illustrate different waveform plots of the TCAM 200 according to the embodiment of FIG. 2A.
Figure 3B:
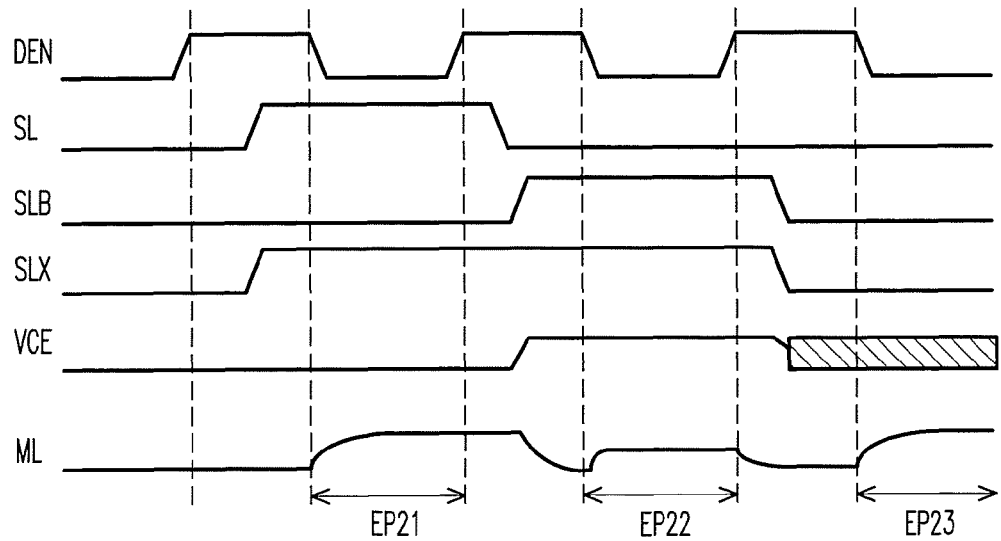

Please refer to FIG. 3A and FIG. 3B and FIG. 2A, wherein FIG. 3A and FIG. 3B respectively illustrate different waveform plots for search operations of the TCAM 200 according to the embodiment of FIG. 2A. The pull-up circuit 240 is controlled by an enable signal DEN to pull-up a voltage level of the match line ML when the enable signal DEN is at logic level 0. In FIG. 3A, during a pre-charge phase PP1, the pull-up circuit 240 is enabled, and the match line ML is pulled up accordingly. Then, in an evaluation phase EP11, a search 1 operation is operated and the search signals SL and SLB are respectively set to logic level 1 and 0. If the stored data of the first memory cell 210 is logic level 0, the voltage level VCE on the common end CE equals to logic level 0. Accordingly, the resistance of the path between the match line ML and the reference ground is adjusted to a high value, and the voltage level on the match line ML can be held on high voltage level. The search result with "match" is obtained.

For operating another search operation, the pull-up circuit 240 is enabled again during a pre-charge phase PP12. Then, during an evaluation phase EP12, a search 0 operation is operated, and the search signals SL and SLB are respectively set to logic level 0 and 1. If the stored data of the second memory cell 220 is logic level 1, the voltage level VCE on the common end CE changes to equal to VDD−Vth during the evaluation phase EP12, and the voltage level on the match line ML can be pulled down by the switch set 230, wherein Vth is a threshold voltage of the transistor MN23. The search result with "miss" is obtained.

The pull-up circuit 240 is enabled again during a pre-charge phase PP13, and the voltage level on the match line ML is pulled-up to high voltage level. Then, during an evaluation phase EP13, a search don't care operation is operated, and all of the search signals SL, SLB and SLX are set to logic level 0, and the voltage level VCE on the common end CE can be changed to high impedance. Accordingly, the resistance of the path between the match line ML and the reference ground GND is adjusted to high value by the switch set 230, and the voltage level on the match line ML is kept at high voltage level, and the search result with "miss" is obtained.

In FIG. 3B, another operation mode is illustrated. In an evaluation phase EP21, the pull-up circuit 240 is enabled by the enable signal DEN, the search signals SL and SLB are respectively set to logic level 1 and 0 for operating the search 1 operation, and the search signal SLX is set to logic level 1 at the same time. If the stored data in the first memory cell 210 is logic level 0, the voltage level VCE on the common end CE is pulled to logic level 0. Such as that, the path between the match line ML and the reference ground GND can be cut-off, and the voltage level of the match line ML can be pulled-up to a first voltage level. The search result with "match" is obtained.

In another evaluation phase EP22, the search 0 operation is operated. During the evaluation phase EP22, the pull-up circuit 240 is enabled by the enable signal DEN again, and the search signals SL and SLB are respectively set to logic level 0 and 1, and the search signal SLX is set to logic level 1 at the same time. If the stored data of the second memory cell 220 is logic level 1, the voltage level VCE on the common end CE is pulled to VDD−Vth, wherein Vth is a threshold voltage of the transistor MN23. Such as that, the transistor MS1 can provide a higher resistance based on the voltage level VCE, and the voltage level on the match line ML can be pulled to a second voltage level smaller than the first voltage level by the switch set 230. The search result with "miss" is obtained.

In an evaluation phase EP23, the search don't care operation is operated. During the evaluation phase EP23, all of the search signals SL, SLB and SLX are set to logic level 0. The common end CE is floated, and the voltage level VCE on the common end CE is high impedance. Based on the search signal SLX with logic level 0, the voltage level on the match line ML is pulled up to logic level 1 by the switch set 230. The common end CE is floated, and the voltage level VCE on the common end CE is unknown. So signal SL_X is set to logic level 0 to cut off the transistor MS2, and the match line ML can be charged to high level during the evaluation phase correspondingly. The search result with "match" is obtained.

Figure 4:
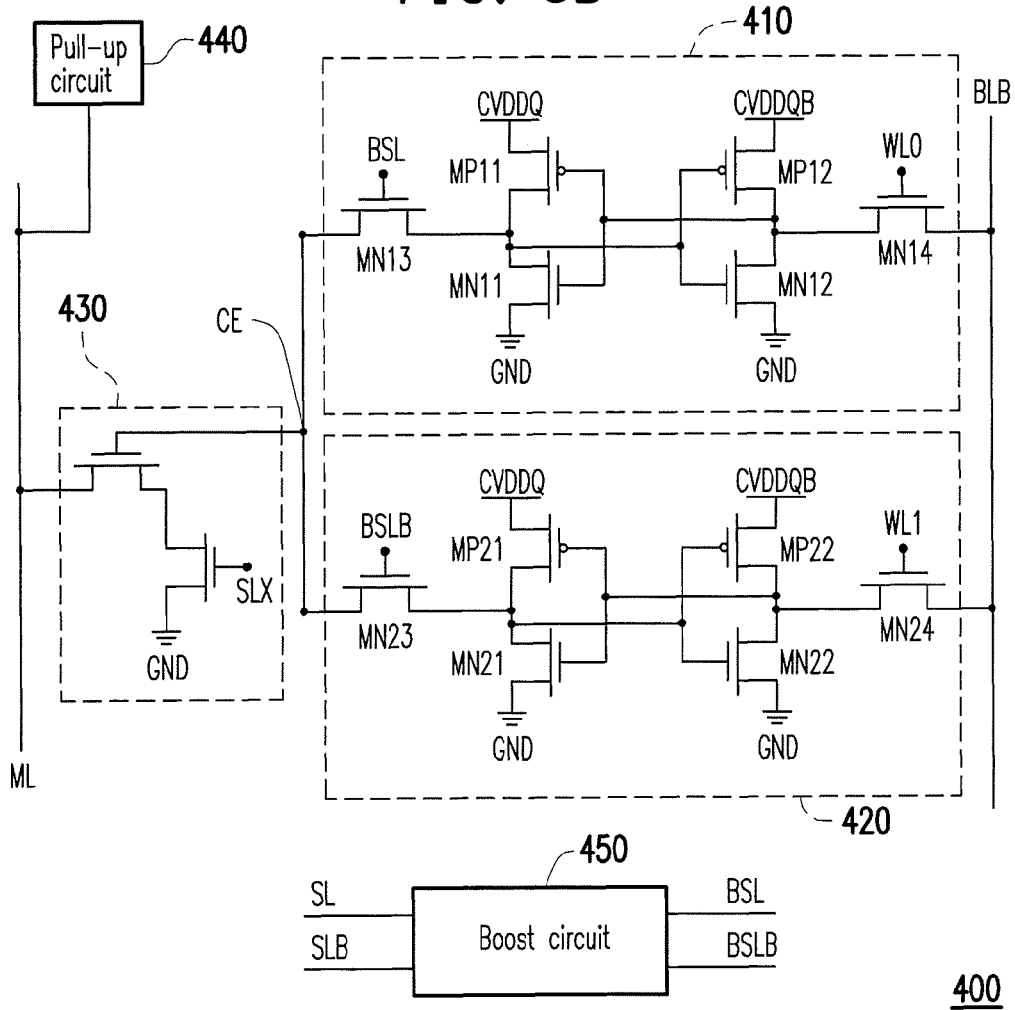
FIG. 4 illustrates a schematic diagram of a TCAM according to another embodiment of present disclosure.

Please refer to FIG. 4, FIG. 4 illustrates a schematic diagram of a TCAM according to another embodiment of present disclosure. The TCAM 400 includes a first memory cell 410, a second memory cell 420, a switch set 430, a pull-up circuit 440, and a boost circuit 450. Different from the TCAMs 100 and 200, the TCAM 400 further includes the boost circuit 450. The boost circuit 450 is coupled to the transistors MN13 and MN23 of the first and second memory cells 410 and 420. The boost circuit 450 receives the search signal SL and SLB, and boosts up a voltage level of each of the search signals SL and SLB to generate each of the boosted search signals BSL and BSLB when each of the search signals SL and SLB is at logic level 1. For example, if the search signals SL is set to logic level 1, the boost circuit 450 boosts up the voltage level of the search signals SL to VDD+Vth1 to generate the boosted search signal BSL. If the search signals SLB is set to logic level 1, the boost circuit 450 boosts up the voltage level of the search signals SLB to VDD+Vth2 to generate the boosted search signal BSLB. Wherein, Vth1 is a threshold voltage of the transistor MN13, and Vth2 is a threshold voltage of the transistor MN23.

It should be noted here, the transistor MN13 and the transistor MN23 can be fully turned on by respectively receiving the boosted search signals BSL and BSLB, and the voltage level on the common end CE may be equal to the power voltage VDD (wherein the power voltage CVDDQ=CVDDQB=VDD in the search operations) without voltage drop when stored data with logic level 1 sent to the common end CE.

Figure 5:
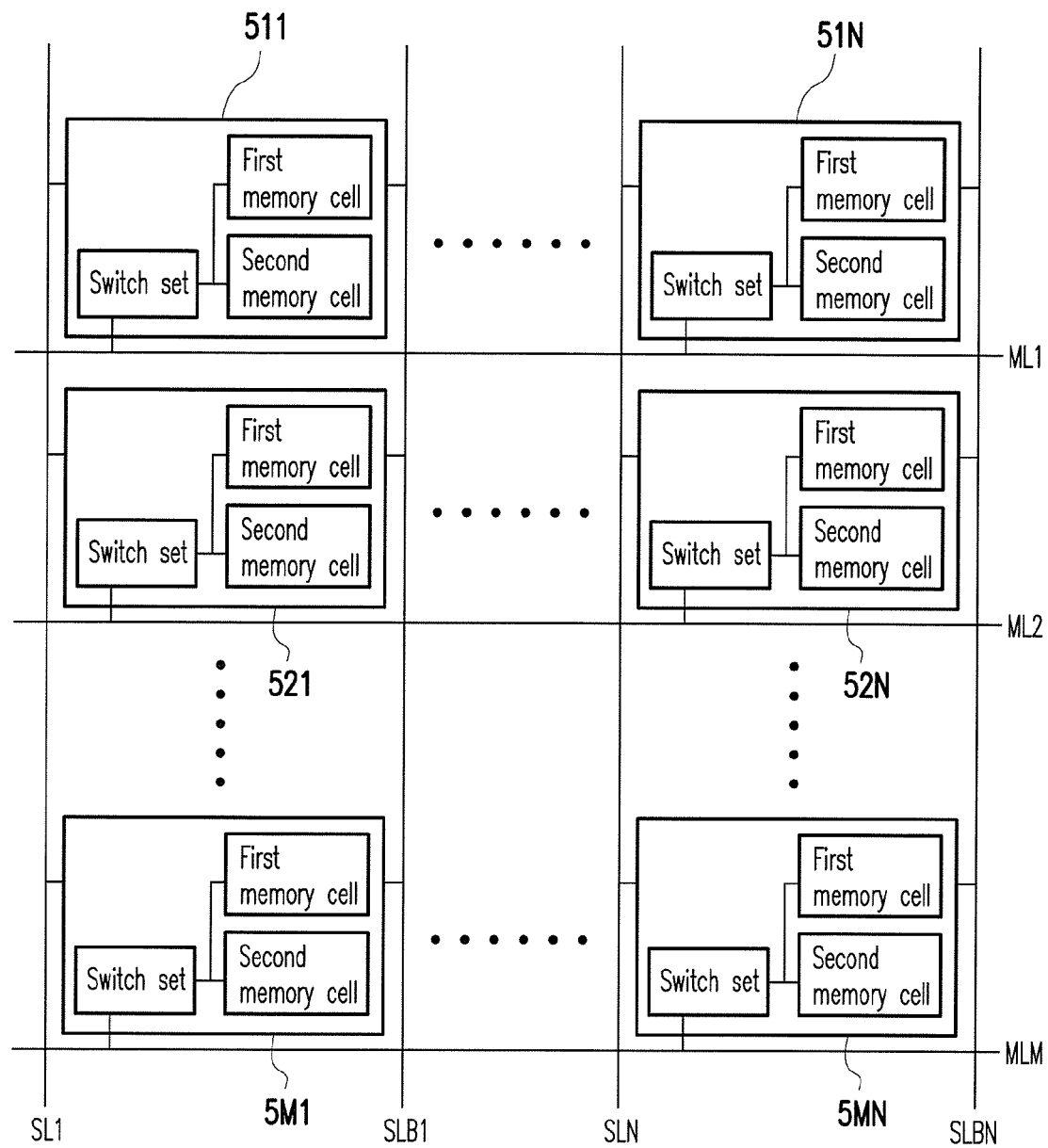
FIG. 5 illustrates a block diagram of a TCAM according to an embodiment of present disclosure.

Please refer to FIG. 5, FIG. 5 illustrates a block diagram of a TCAM according to an embodiment of present disclosure. The TCAM 500 includes a plurality of circuit blocks 511-5MN. The circuit blocks 511-5MN are arranged in an array, and each of the circuit blocks 511-5MN can provide an encoded bit. Each of the TCAM 500 can be implemented by the TCAM 100 or TCAM 200 of previously embodiments. Each of the circuit blocks 511-5MN includes a first memory cell, a second memory cell, and a switch set. In FIG. 5, the circuit blocks 511, 521-5M1 arranged in a first column, and the circuit blocks 511, 521-5M1 receive the search signals SL1 and SLB1. The circuit blocks 51N, 52N-5MN arranged in a last column, and the circuit blocks 51N, 52N-5MN receive the search signals SLN and SLBN. Furthermore, the circuit blocks 511-51N arranged in a first row and coupled to a match line ML1; the circuit blocks 521-52N arranged in a second row and coupled to a match line ML2; and the circuit blocks 5M1-5MN arranged in a last row and coupled to a match line MLM. In the search operation, if the search result of one of the circuit blocks in the same row is miss, the corresponding match line is set to logic level 0, and if the search results of all of the circuit blocks in the same row are match, the corresponding match line is set to logic level 1.

In summary, present disclosure provides a TCAM, and the TCAM can provide one encoded bit by two memory cells and a switch set. In the embodiment of present disclosure, only 14 transistors are needed for providing one encoded bit in the TCAM. A circuit area can be saved and the cost can be reduced correspondingly.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents

What is claimed is:

1. A ternary content addressable memory (TCAM), comprising:
    at least one first memory cell, receiving a first search signal, determining whether to send first stored data to a common end or not according to the first search signal;
    at least one second memory cell, receiving a second search signal, determining whether to send second stored data to the common end or not according to the second search signal; and
    at least one switch set, coupled to the common end, a reference ground, and a match line, adjusting a resistance of a path between the match line and the reference ground according to a voltage level on the common end and a third search signal,
    wherein the switch set comprises:
    a first switch, having a control end coupled to the common end, and a first end coupled to the match line; and
    a second switch, having a first end coupled to a second end of the first switch, a second end coupled to the reference ground, and a control end receiving the third search signal.

2. The TCAM according to claim 1, wherein if the first search signal is at a first logic level and the second search signal is at a second logic level, a search 1 operation is operated, if the first search signal is at the second logic level and the second search signal is at the first logic level, a search 0 operation is operated, and if both of the first search signal and the second search signal are at the second logic level, a search don't care operation is operated.

3. The TCAM according to claim 2, wherein if the search 1 operation or the search 0 operation is operated, the third search signal is at the first logic level, and if the search don't care operation is operated, the third search signal is at the second logic level.

4. The TCAM according to claim 2, further comprising:
    a pull-up circuit, coupled to the match line, for pulling up a voltage level of the match line according to a power voltage during a pre-charge phase or an evaluation phase.

5. The TCAM according to claim 4, wherein the pull-up circuit pulls up a voltage level of the match line to the first logic level during the pre-charge phase before each of the search 0, search 1, and search don't operations being operated, the switch set pulls down the voltage level of the match line to the reference ground during the evaluation phase if a search result of each of the search 0, search 1, and search don't operations is miss, and the voltage level of the match line is held on the first logic level during the evaluation phase if the search result of each of the search 0, search 1, and search don't operations is match.

6. The TCAM according to claim 4, wherein a voltage level of the match line is held on the reference ground during the pre-charge phase before each of the search 0, search 1, and search don't operations being operated, the pull-up circuit pulls up the voltage level of the match line to a first voltage level during the evaluation phase if a search result of each of the search 0, search 1, and search don't operations is match, and the pull-up circuit pulls up the voltage level of the match line to a second voltage level during the evaluation phase if the search result of each of the search 0, search 1, and search don't operations is miss,
    wherein the first voltage level is larger than the second voltage level.

7. The TCAM according to claim 2, wherein if the search don't care operation is operated, the path between the match line and the reference ground is cut-off according to the third search signal.

8. The TCAM according to claim 1, wherein each of the first memory cell and the second memory cell comprises:
    a data latch, having a data end for receiving or outputting a stored data, and an inverted data end for receiving or outputting an inverted stored data; and
    a first switch, coupled between the common end and the data end, and controlled by the corresponding search signal to be turned on or cut-off.

9. The TCAM according to claim 8, wherein each of the first memory cell and the second memory cell further comprises:
    a second switch, coupled between the inverted data end and a bit line, and controlled by a word line signal.

10. The TCAM according to claim 9 wherein the data latch comprises:
    a first transistor, having a first end receiving a first power voltage, a second end coupled to the data end, and a control end coupled to the inverted data end;
    a second transistor, having a first end coupled to the data end, a second end coupled to the reference ground, and a control end coupled to the inverted data end;
    a third transistor, having a first end receiving a second power voltage, a second end coupled to the inverted data end, and a control end coupled to the data end; and
    a fourth transistor, having a first end coupled to the inverted data end, a second end coupled to the reference ground, and a control end coupled to the data end.

11. The TCAM according to claim 10, wherein the first switch comprises:
    a fifth transistor, having a first end coupled to the data end, a second end coupled to the common end, and a control end for receiving the corresponding search signal.

12. The TCAM according to claim 11, further comprising:
    a boost circuit, coupled to the control end of the fifth transistor, for booting up a voltage level of the corresponding search signal by a threshold voltage of the fifth transistor when the corresponding search signal is at logic level 1.

13. The TCAM according to claim 10, wherein during a writing operation, a voltage level of the first power voltage and a voltage level of the second power voltage are varied according to an offset voltage,
    wherein, if the voltage level of the first power voltage is increased by the offset voltage, the voltage level of the second power voltage is decreased by the offset voltage, and if the voltage level of the first power voltage is decreased by the offset voltage, the voltage level of the second power voltage is increased by the offset voltage.

* * * * *